United States Patent [19]
Nunally

[11] Patent Number: 5,260,946
[45] Date of Patent: Nov. 9, 1993

[54] SELF-TESTING AND SELF-CONFIGURATION IN AN INTEGRATED CIRCUIT

[75] Inventor: Patrick O. Nunally, Diamond Bar, Calif.

[73] Assignee: Hughes Missile Systems Company, Los Angeles, Calif.

[21] Appl. No.: 709,517

[22] Filed: Jun. 3, 1991

[51] Int. Cl.⁵ .......................................... G11C 29/00
[52] U.S. Cl. ................................ 371/22.1; 371/22.4; 371/22.5
[58] Field of Search ............... 371/10.1, 10.2, 10.3, 371/11.1, 21.1, 21.2, 22.1, 22.3, 22.4, 22.5, 22.6, 24, 25.1, 27

[56] References Cited

U.S. PATENT DOCUMENTS

4,959,832  9/1990  Bardell, Jr. ........................... 371/27
5,138,619  11/1992  Fasang et al. ...................... 371/22.5
5,195,097  3/1993  Bogholtz, Jr. et al. ............... 371/27

Primary Examiner—Vincent P. Canney
Attorney, Agent, or Firm—Charles D. Brown; Randall M. Heald; Wanda Denson-Low

[57] ABSTRACT

Integration at the chip level is supported by an architecture for self-testing and self-configuration of an integrated circuit. Self-testing requires the generation of test signals based on primary root polynomials, application of the test signals to functionally redundant modules, and evaluation of the response of the modules to the test signals. The response produced by a module is compared against the response predicted from error-free operation of the module. Modules whose responses correspond to the expected responses are interconnected for circuit operation. All of the architecture for self-testing and self-configuration is integrated with the tested and configured modules.

15 Claims, 6 Drawing Sheets

| ADDRESS | SEGMENT SIGNATURE |
|---|---|
| ⋮ | ⋮ |
| ADDRESS +M | CONTROL WORD |
| ⋮ | ⋮ |

SELF-TESTING AND SELF-CONFIGURATION IN AN INTEGRATED CIRCUIT

CROSS REFERENCE TO RELATED PATENT APPLICATION

This patent application contains material related to U.S. patent application Ser. No. 07/259,386, filed Oct. 18, 1988, for "FAULT-RESISTANT SOLID STATE LINE DRIVER", the inventor of which is PATRICK O. NUNALLY, and which is assigned to the Assignee of this application.

BACKGROUND OF THE INVENTION

The invention is concerned with the self-analysis and self-organization of an integrated circuit. The invention is particularly concerned with the testing and configuration of clusters of functionally-equivalent modules in an integrated circuit by a test and configuration architecture which is integrated into a common monolithic structure with the functionality clusters.

Development of fault-tolerant systems at the semiconductor level has many obstacles. No portion of a semiconductor can ever be guaranteed to be functional. The problem, therefore, in the fabrication, testing, and configuration of integrated circuits is the detection of failed devices and the substitution of other, operable devices for the failed ones. The ability to detect malfunctioning devices and to substitute spares which are in the same integrated monolithic circuit have the effect of increasing device yields. Devices which have been tested as operable can be interconnected with other, similarly tested devices which are in the same integrated circuit with the result that apparatus or system integration can occur at the wafer scale level.

Wafer scale integration requires architectural fault tolerance dependent upon effective testing and reconfiguration of component devices. To date, there have been two common approaches to fault diagnosis and recovery: centralized and distributed.

In a centralized scheme, the architecture of an apparatus or system whose components reside on a single chip typically incorporates a routing grid of all test points to a centralized I/0 port. This centralized port may perform some base processing; however, its primary function is to pass data from the individual devices on the chip to an external device. The external device is required to initiate device testing, provide test vectors to portions of the wafer using specialized test buses, and interconnect the wafer system to a specialized command bus. There are disadvantages to this structure. First, failure of the centralized device results in a complete failure of the system. By requiring all portions of a wafer to be exercised by an external portion, or by a single device, there is usually a restriction on the variations of testability within the system. This architecture is also disadvantageous in requiring external systems to exercise the wafer.

In a distributed scheme of self-testing and configuration, the functional portions of a wafer are responsible for performing periodic self-testing and reconfiguration based on nearest-neighbor data. This architecture uses the devices themselves in a very complicated and usually non-standard state machine structure. In distributed architectures, a large circuit increase is typical due to the increase in circuit complexity associated with nearest neighbor self-test. Distributed architectures are also not usually capable of removing devices associated with test from the main body of the data path. This results in a slower system overall simply due to the computational overhead associated with architectural distribution. These architectures also tend to be very inflexible due to the complexity of the state machines necessary to perform testing and reconfiguration. Distributed architectures typically find their primary application in integrated systems having highly regular structures. An example of a system with a regular structure is a semiconductor memory.

SUMMARY OF THE INVENTION

The invention concerns a new architecture which incorporates advantages of both centralized and distributed approaches to fault diagnosis and recovery. The architecture involves two fundamental components: a test signal generator which produces a maximum number of non-zero test signal states with a minimum of components and a configuration manager which analyzes the response of functional modules to the test signals and which configures the functional circuits according to the analysis.

It is known in the art of fault-tolerant wafer scale systems to provide clusters of functionally-equivalent circuit portions, to test the portions, and to assemble tested portions by selective connection to input and output signal paths in an integrated circuit. See, for example, U.S. Pat. Nos. 3,805,039 and 4,698,807. See also the article entitled "YIELD AND RELIABILITY ENHANCEMENT VIA REDUNDANCY FOR VLSI CHIPS AND WAFERS" in the IBM Technical Disclosure Bulletin, Volume 28, No. 1, June, 1985, at pp 36-42.

In this regard, the invention concerns, first, a test signal generator in an integrated circuit device which includes:

a plurality (n) of storage devices which are connected in an $N \times 1$ array for serial shifting of binary signals in a shifting direction from an nth storage device to a first storage device, each storage device having a position in the $N \times 1$ array which corresponds to a position of a respective variable in a polynomial of the nth degree;

a first set of modulo-two adders, each of which corresponds to a respective root variable of a first primary root polynomial (PRP1), each adder connected to the storage devices for conditioning the state of a storage device which corresponds to the position, in the shifting direction, of the ith root variable of PRP1, the adder conditioning the state of the storage device in response to a state of the first storage device and a state of the storage device corresponding to position $i+1$ in PRP1;

a second set of modulo-two adders, each of which corresponds to a respective root variable of a second primary root polynomial (PRP2), each adder connected to the storage devices for conditioning the state of a storage device which corresponds to the position, in a direction opposite the shifting direction, of the jth root variable of PRP2, the adder conditioning the state of the storage device in response to a modification signal and the state of the first storage device; and a compactor for generating the modification signal as a binary string representing PRP2.

The configuration management architecture is provided in an integrated circuit device which includes input and output terminals, a functionality cluster, means for configuring the functionality cluster by selectively connecting portions of the functionality cluster to the input and output terminals in response to a configuration signal, and a test mechanism for testing the operation of the functionality cluster and indicating the operation by means of a response signal string. In this regard, the configuration management architecture generates the configuration signal and includes:

a counter for subdividing the response signal string into segments;

a segment signature portion connected to the counting circuit and responsive to response signature string segments for producing functionality cluster segment signature signals, each segment signature signal being produced in response to a respective response signal string segment and including a binary string which represents the error-free generation of a response signal string segment by a predetermined portion of the functionality cluster; and a configuration signal generator connected to the counting and segment signature circuits for generating a configuration signal conditioned to select functionality cluster portions which generate error-free response segment signal strings.

DETAILED DESCRIPTION OF THE PREFERRED EMBODIMENTS

Integrated circuit reliability is enhanced by partitioning of a circuit into modules which are connected serially for test, and with the provision of redundant copies of each module. When one module fails, it can be disconnected and one of its copies connected in its place. Typically, steering buses are employed to interconnect the modules with each other and with input and output terminals of the integrated circuit. The technique is embodied in the illustration of FIG. 1, which shows the functional layout of an integrated circuit according to the invention. Relatedly, all of the components illustrated in FIG. 1 are incorporated into a single, monolithic integrated circuit.

Figure 1:
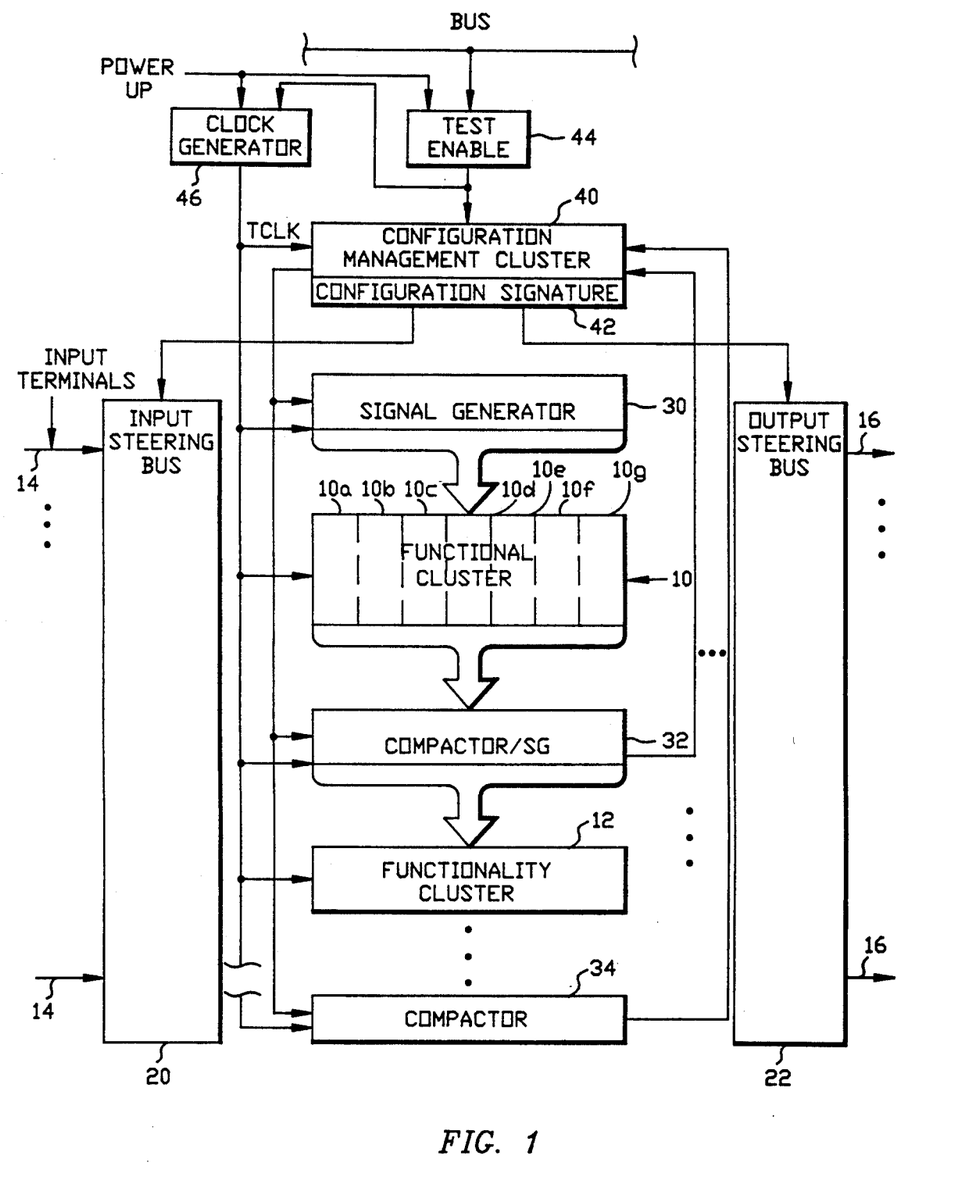
FIG. 1 is a block diagram illustrating an integrated circuit with self-testing and self-configuring means according to the invention.

In FIG. 1, a set of modules is called a "functionality cluster", two of which are indicated by reference numerals 10 and 12. The functionality cluster 10 is shown in detail and includes redundant, functionally equivalent modules 10a-10g. The representation of module redundancy in the functionality cluster 10 is not meant to imply that such redundancy is provided by physically separate, geometrically adjacent replications of an integrated circuit function. Indeed, those skilled in the art will appreciate that functional redundancy can be provided in a wide variety of architectures, some of which thread identical modules in nested or hierarchical fashion. However, the representation of the functionality cluster 10 is useful for emphasizing provision of a plurality of identical copies of a modular function.

The selection of functional modules in a cluster and the interconnection of those selected modules with other selected modules and with input terminals 14 and output terminals 16 is typically by way of steering buses.

Figures 2, 4A, 4B, 4C:
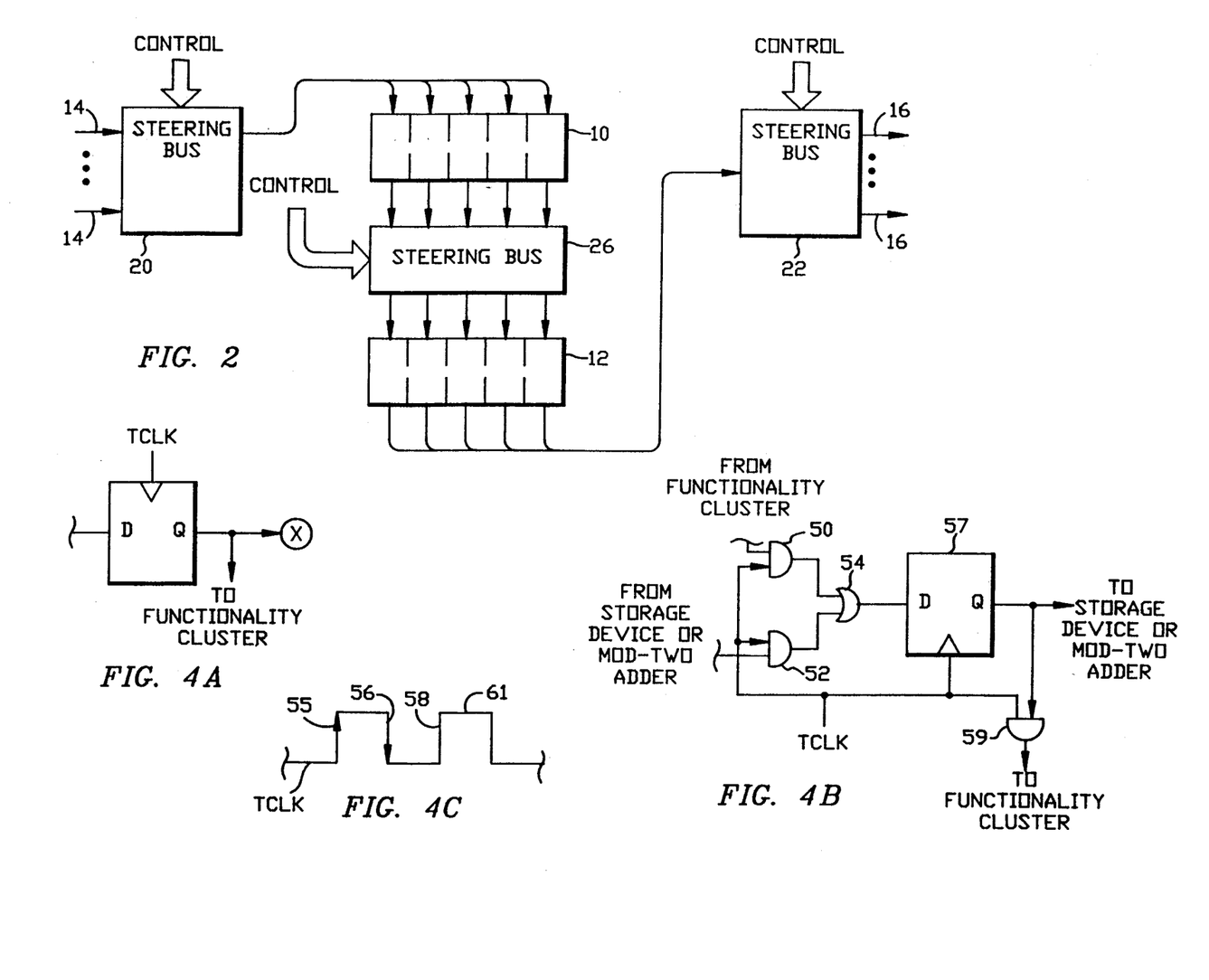
FIG. 2 illustrates selective connection of functionality cluster portions to input and output terminals.
FIG. 4A illustrates a representative storage cell used in the signal generator and compactor of FIG. 3.
FIG. 4B and 4C illustrate the structure and operation of a representative storage call used in the compactor of FIG. 3.

As shown in FIGS. 1 and 2, an input steering bus 20 is operated to selectively steer input signals from input terminals 14 to a first functionality cluster 10. The steering bus 20 is operated to establish connections between input terminals and selected input ports of the functionality cluster 10. The steering bus 26 connects outputs of modules in the functionality cluster 10 with inputs to modules of the functionality cluster 12. The outputs of the functionality cluster 12 are connected through the steering bus 22 to output terminals 16.

The interconnection of selected modules with other selected modules and with input and output terminals is accomplished in steering buses which employ conventional multiplexing techniques. Importantly, the steering buses can be considered as multiplexers whose patterns of connectivity between input and output are set by control signals. In this respect, control signals input to a steering bus effectively select the modules in each of two functionality clusters which are to be connected for system operation. Changing the control signal changes the selection; therefore, a mechanism which generates the control signal for the steering buses effectively configures the integrated circuit. Such a mechanism is referred to hereinafter as "configuration mechanism".

In order to determine how a system is to be configured in an integrated circuit partitioned as illustrated in FIG. 1, a configuration manager must first test the functionality clusters in order to determine which of the available modules in each cluster are operating correctly. Typically, the modules of a functionality cluster are tested by generating test signals which are applied to all modules of the cluster and evaluating the response which the test signals elicit. Circuitry which is devoted strictly to test signal generation and evaluation demands valuable space in an integrated circuit. Hence, any test signal mechanism which reduces the circuitry dedicated to testing will make more room for circuitry devoted to circuit operation.

THE INVENTION

The invention concerns a mechanism which generates test signals with a minimum of dedicated circuitry and a configuration mechanism which is incorporated into an integrated circuit to provide a centralized architecture for self-test, self-configuration, and self-validation. These aspects are shown in the block diagram of FIG. 1.

In FIG. 1, the functionality clusters are interleaved with means for generating and collecting test signals. A signal generator 30 generates a test signal which is input to the functionality cluster 10. The response of the cluster to the test signal is output to a device called a compactor 32, which also acts as a test signal generator for the next functionality cluster 12. The compactor 34 receives the test signal response of the last functionality cluster (not shown).

A configuration management cluster 40 is connected to receive signals indicative of the current state of each of the compactors 32, 34. The current state of each compactor indicates the response of the preceding functionality cluster to test signal stimulation. The response is compared against expected response in the configuration management cluster to determine which modules in a functionality cluster are operating correctly. Following testing, this enables the configuration management cluster 40 to select the modules of each functionality cluster which are to be interconnected in configuring the required system. The selection is in the form of a signal called a "configuration signature", which is registered in the configuration management cluster at 42. The configuration signature in the register 42 embraces the control signals which establish the connectivity in the steering buses. Therefore, the configuration signature in the register 42 precisely describes the modular interconnections between functionality clusters and between functionality clusters and input and output terminals.

To complete the description, test enable means 44 are incorporated into the integrated circuit which contains the invention, the functionality clusters and the steering bus mechanisms, together with clock generation means 46. The test enable means 44 is connected to an externally-accessible address bus which may be sourced from an off-circuit location to initiate, control, and terminate the operation of the configuration management cluster 40. The clock generator means 46 is incorporated into the integrated circuit and is conventional in all respects, providing multi-phase clocks for all circuit functions, including a test clock (TCLK) used during circuit tests in configuration according to the invention.

Since failures most frequently occur in an integrated circuit when it is cycled on and off, the test and configuration functions of the invention are invoked whenever the circuit is turned on, as indicated by a POWER UP signal. The POWER UP signal causes the test enable means 44 to initiate a circuit test and configuration sequence by configuration management cluster 40 and operates the clock generator means 46 to produce TCLK. The POWER UP signal is independent of external data or addressing.

When a test and configuration sequence is initiated, the configuration management cluster 40 initializes the signal generator 30, all compactor/signal generators (32 et al) and the compactor 34. These elements, and the functionality clusters, are clocked by TCLK. When initialized, the signal generator operates as described below to generate a sequence of test signals which are input to the functionality cluster 10. The test signals are clocked into the functionality cluster 10 which reacts to them, producing response signals collected at the compactor/signal generator 32. Concurrently, with collecting the response of the functionality cluster 10 to the test signals produced by the generator 30, the compactor/signal generator generates test signals for the following functionality cluster 12, and so on. While collecting cluster responses and generating test signals, the compactor/signal generators feed back to the configuration management cluster 40 signals which indicate their current state. These current state signals are compared by the configuration management cluster with stored signatures. The comparison between signatures and compactor outputs indicates which modules of a functionality cluster are operating correctly. The comparisons extend over time in order to give all gates in a functionality cluster module an opportunity to change state at least once. Incorrect operation is indicated by deviation of a functionality cluster module response from an expected response embodied in the signatures available to the configuration management cluster.

After the period of time measured by a succession of TCLK oscillations, the configuration management cluster disables the signal generators and compactors, selects functionality cluster modules, and assembles the configuration signature to reflect the selection. When the configuration signature is fully assembled, the test and configuration sequence is ended, the steering bus mechanisms are activated, and circuit operation can begin.

Figure 3:
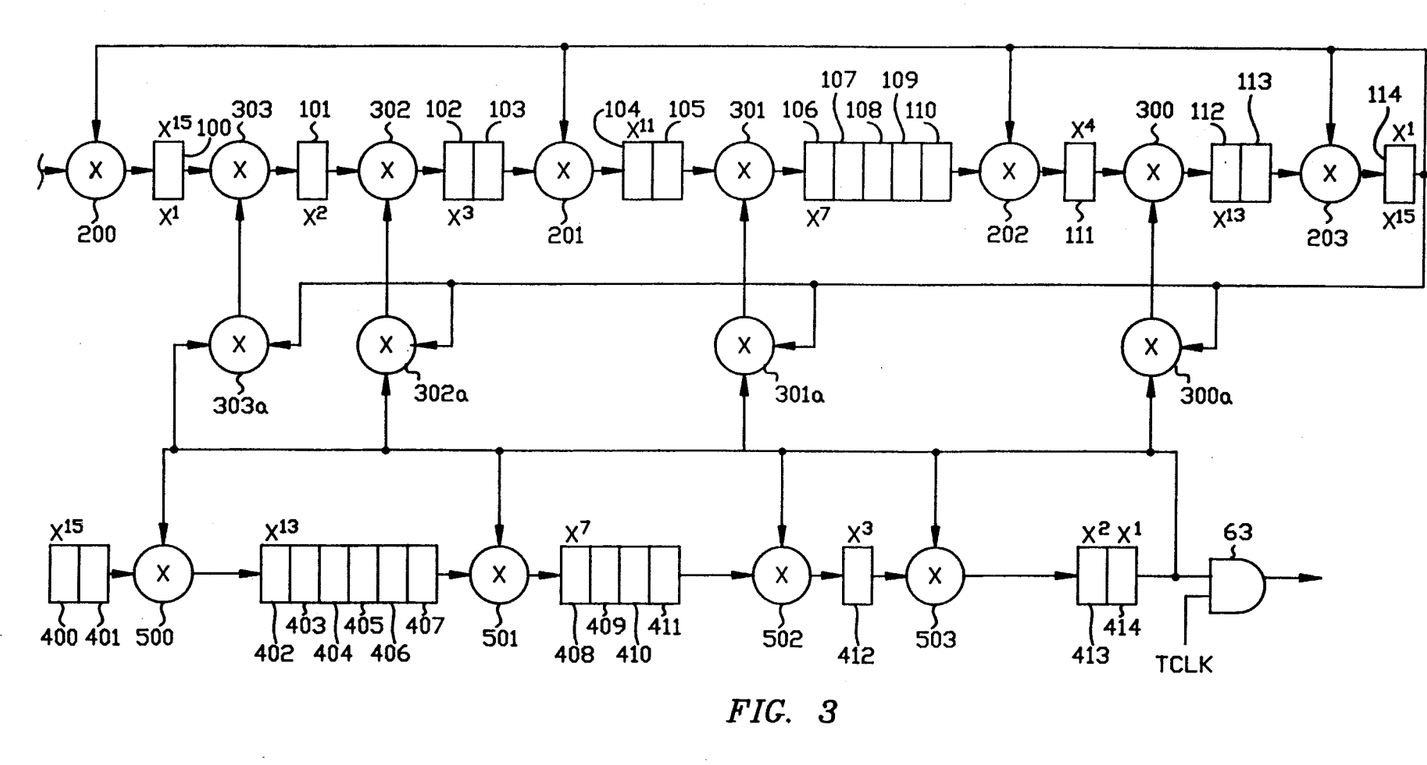
FIG. 3 illustrates a test signal generator and compactor according to the invention.

FIG. 3 illustrates the structure of a test signal generator/compactor according to the invention. The test signal generator includes a series of sequentially-connected storage devices 100–114 which can comprise, for example, D-type flip-flops. Typically, test signal generators comprise storage devices which are used in a configured circuit for signal storage. During testing, they are conventionally assembled as shift registers which are used in signal generation. In the invention, each of the storage devices 100–114 corresponds to a variable position in a polynomial of the 15th order. In this regard, if the polynomial has the form:

$$c_1 x^{15} + c_2 x^{14} + \ldots c_{15} x^1 + c_{16}$$

the storage device 100 corresponds to the position occupied by $x^{15}$, while the storage device 114 corresponds to the position occupied by the variable $x^1$. Thus, an nth order polynomial can be represented by a serially-connected sequence of storage devices in which the storage device at location i corresponds the variable $x^i$; this is referred to as the position of the ith variable.

A first set of modulo-2 adders 200, 201, 202, and 203 is connected to the inputs of the storage devices 100, 104, 111, and 114, respectively. Each modulo-2 counter represents a respective root variable in the following primary root polynomial:

$$x^{15} + x^{11} + x^4 + x^1 + 1$$

thus, the modulo-2 adder 201 has its output connected to the input of storage device 104, which represents the root variable $x^{11}$. Generally, each modulo-2 adder in the first set of modulo-2 adders represents the ith root variable in a first primary root polynomial (PRP1) and is connected to condition the storage device at the corresponding polynomial position taken in the shifting direction, that is, from the 15th storage device 100, toward the first storage device 114. Each modulo-2 adder of the first set of modulo-2 adders conditions the state of the storage device to whose input it is connected in response to the current state of the first storage device 114 and the state of the storage device at the i+1 positin of PRP1, taken in the shifting direction. Thus, the modulo-2 adder 201 conditions the storage device 104 representing the root variable $x^{11}$ in response to the state of the first storage device 114 and the state of the storage device 103 representing the position of the 12th polynomial variable.

Consider now the reversal of the polynomial positions by taking the sequence of storage devices in a direction opposite the shifting direction. In this case, the storage device 114 represents the polynomial position for $x^{15}$, while the storage device 100 represents the variable position for $x^1$. In this direction, a second set of modulo-2 adders 300-303 occupies a respective root variable position of a second primary root polynomial (PRP2), which is given by:

$$x^{13}+x^7+x^3+x^2+1$$

thus, for example, the modulo-2 adder 301 occupies the position corresponding to root variable $X^7$ of PRP2. Each modulo-2 adder of the second set of modulo-2 adders, therefore, conditions the state of a storage device corresponding to a root variable position of a primary root polynomial taken in a direction opposite the shifting direction. Each of these modulo-2 adders responds to two inputs. Thus, for modulo-2 adder of the second set which corresponds to the jth root variable position in PRP2, one of its inputs comes from the output of the storage device representing the $j-1$th polynomial position taken in the direction which is opposite the shifting direction. Each of the second set of modulo-2 adders also receives an input from an ancillary modulo-2 adder. The ancillary modulo-2 adders 300a-303a respond to the output of the first storage device 114 and to a modification bit from the first storage device of a compactor.

The compactor includes storage devices 400-414 which are serially connected for shifting in the direction from the storage device 400 to, and through, storage device 414. The storage devices of the compactor represent a polynomial of the 15th degree, with each storage device representing a variable position in the polynomial, taken in the shifting direction. Thus, storage device 402 represents the location for the variable $x^{13}$. As FIG. 3 illustrates, the compactor includes modulo-2 adders 500-503 which are connected to the storage devices 400-414 in the manner described above to configure the compactor according to PRP2. In this regard, for example, the modulo-2 adder 501 conditions the state of the storage device 408 representing the root variable $x^7$ in PRP2. As described above, each of the modulo-2 adders 500-5003 conditions the storage device to whose input it is connected in response to the state of the storage device representing the next-higher variable position and the state of the first storage device 414. The state of the first storage device is also provided as the modification signal to the ancillary modulo-2 adders 300a-300-a.

The storage devices which form the signal generator and compactor illustrated in FIG. 3 are conventional. When considered as D-type flip-flops, these devices can be initialized to a predetermined state at POWER-UP and then can operate as conventional flip-flops upon the provision of a shifting clock.

In the invention, when used for test signal generation, the storage devices of the signal generator operate in response to the rising edge of each phase of TCLK, thereby generating a test signal string at the frequency of TCLK. Thus, the output of each signal generator storage device can change state only once each period of TCLK. As FIG. 4A shows, the output of each signal generator storage device, in addition to being fed forward either to a modulo-2 adder or another storage device is provided to an input of a functionality cluster. In those storage devices which feed forward to a modulo-2 adder, the functionality cluster is fed in parallel with the adder.

Every compactor/signal generator and the bottommost compactor in the architecture of the invention shifts serially in the shifting direction at twice the rate of TCLK, with each storage device capable of changing the state in response to each transition of TCLK. FIG. 4B illustrates the input connection architecture for storage devices in a compactor/signal generator and compactor. In these units, each storage device operates in response to each transition in every period of TCLK. This is illustrated in FIG. 4C. One clock period of TCLK in FIG. 4C includes a rising edge 55 and and falling edge 56. At the rising edge 55, the AND gate 50 is activated to gate through the OR device 54 a bit output from a functionality cluster in response to a test signal. The functionality cluster output is then provided at the output of the compactor storage device 57 during the falling edge of TCLK 56. Concurrently, the falling edge 56 activates the AND gate 52 whose other input is connected to the output of the prior storage device or modulo-2 adder in the compactor. This bit is provided at the output of the storage device 57 during the next rising edge 58 of TCLK. If the storage device 57 is in a compactor/signal generator, its output is gated through the AND device 59 to the following functionality cluster in response to active levels of TCLK, such as the level 61. This results in provision of a test signal bit which has been processed by the compactor, in contrast to a functionality cluster response bit which would be available at the output of the device 57 at the low level of TCLK between a falling and rising edge. However, the response of a functionality cluster is provided during the negative levels of TCLK. Hence, a response signal string is obtained from the output of a compactor/storage device as illustrated in FIG. 3, where the AND device 63 is gated by the positive level of TCLK, which provides a succession of bits comprising a response signal string which is provided to the configuration management cluster 40.

The signal generators and compactors of the invention are created conventionally using existing storage devices which, after test and configuration, are incorporated into the configured system. By interconnecting these structures into scan chains with modulo-2 adders, the generators and compactors can be inserted into the system with a fractional percentage circuit increase. The registers formed by chaining the storage devices are "seeded" with a PRP. The test signal architecture utilizes the PRP seeded into a generator in the forward shifting direction. However, the test signal generated is modulated by feeding the modified bit from the following compactor at the variable root locations of the PRP seeded in the compactor (PRP2 in FIG. 3). This modification minimizes the likelihood of an all-zeros or all-ones state occurring in the test signal. It is desirable to avoid either of these states because they correspond to known failure modes in integrated circuit technology.

The inventor has observed that, when the "seed" polynomials for signal generators and compactors are of the class characterized as primary root polynomials, the length of a signal generator or compactor in terms of signal gates and modulo-2 adders can be held to a minimum if the polynomial is a primative polynomial, which is one of the polynomials classed as a primary root polynomial. As is known, a primative polynomial of degree n is a polynomial that divides $(1+x^k)$ for $k=2^n-1$, but not for any integer smaller than k.

As stated previously, the signal generators and compactors are designed to assume predetermined states at power-up. Since the polynomials with which they are seeded are also known, as is the transfer function of each module of each functionality cluster, the response of each module to a sequence of test signals can be determined. That is, the string of bits generated by a functionality cluster in response to a sequence of test signals (a "response signal string") and collected by a compactor after a period of time measured in cycles of TCLK can be determined beforehand. The predicted response signal strings represent error-free module operation. Therefore, they can be stored at the configuration management cluster and compared with the actual response signal strings generated by module operation.

Figure 5:
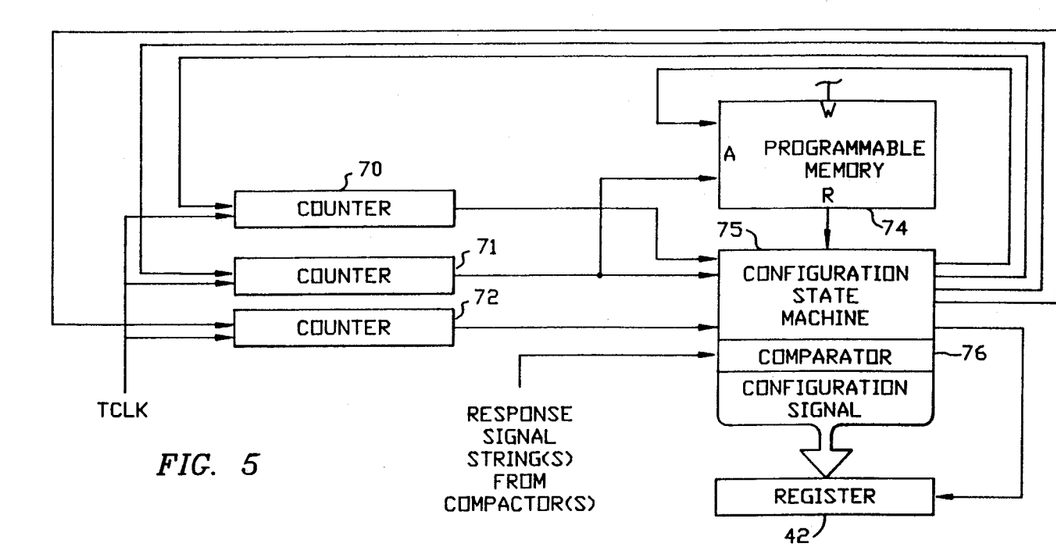
FIG. 5 illustrates the architecture of a configuration manager in FIG. 1.

FIG. 5 illustrates the architecture of the configuration management cluster 40 of FIG. 1. The configuration management cluster includes a plurality of counters, 70, 71, and 72, which count TCLK cycles, providing outputs when preset counts are reached. A programmable memory 74 stores the signatures which correspond to error-free processing of test signal strings by functionality cluster modules. The programmable memory 74 also stores control words which govern state transition sequences of a configuration state machine 75. When a signature is passed to the configuration state machine 75 from the memory 74, the signature is compared in a comparator section 76 of the state machine with a response signal string corresponding to the segment whose error-free operation the signature represents. The operation of the comparator section 76 determines whether a module in a functionality cluster is operating correctly. If the comparator indicates error-free operation, the configuration state machine conditions a portion of the configuration signature in the register 42 to connect the correctly-operated module into the operational configuration.

In operation, when a test and configuration cycle is initiated, the configuration state machine 75 sets count thresholds in the counter 70, 71, and 72, and waits for the counters to provide signals indicating that the thresholds have been reached. The counter 70 is set to a count which defines the edge of a response cycle in which a response string will be provided from every functionality cluster in a group being tested during the cycle. The counter 71 is set to count between the window edge defined by the counter 70 and a subcycle which encloses a response signal string for a particular functionality cluster. The counter 72 is preset to divide the subcycle defined by the counter 71 into predetermined segments each of which defines where in the response signal string for the particular functionality cluster the response of a respective module in the functionality cluster can be detected.

Figure 6:
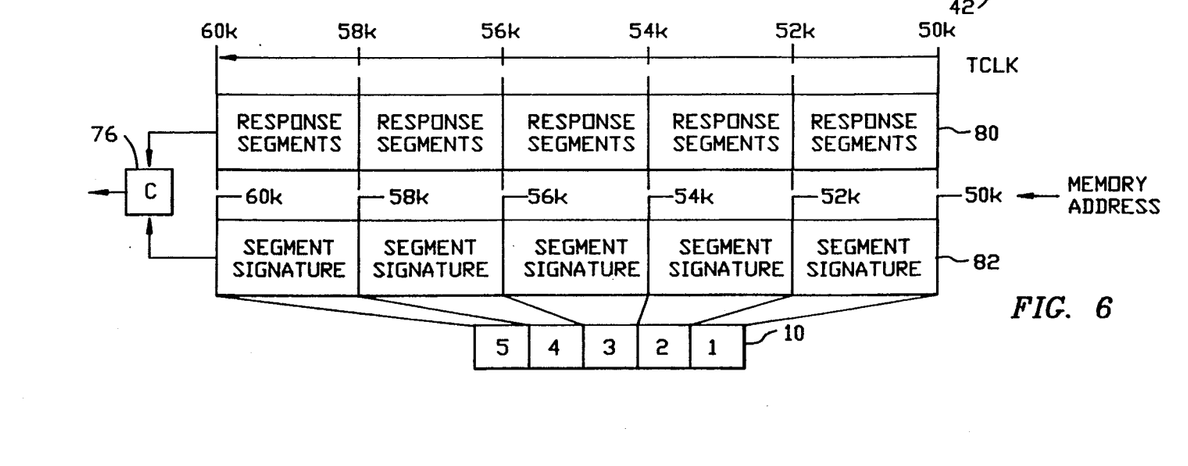
FIG. 6 illustrates a correspondence of response signal string segments with functionality cluster portions.

For example, in FIG. 6, the response signal string 80 from the functionality cluster 10 extends from TCLK cycle 50K to cycle 60K, embracing 10K bits. The functionality cluster 10 is architected such that the segment of the response signal string 80 extending from TCLK 50K through period 52K contains the response of cluster module 1. Similarly, the response of cluster module 2 is contained in the response signal string segment extending between clock periods 52K and 54K.

The output of the counter 71 is used to form a part of the address input to the programmable memory 74, the remainder being provided by the configuration state machine 75. Stored in the memory 74 are sets of segment signatures, each segment signature including a binary string which represents the error-free response of a functionality cluster module to the test signal string provided to the functionality cluster. In FIG. 6, sequence 82 represents a succession of segment signatures output from the programmable memory from memory address which correspond to the TCLK demarcations which subdivide the response signal string 80 into the response segments. Each segment signature is a binary string which represents the error-free generation of a response signal string segment by a predetermined portion of the functionality cluster whose response is being tested. Thus, the segment signature stored in the memory 74 between address 50K and address 52K represents the error-free generation of a response signal string segment by module 1 in the functionality cluster 10. Response segment 1 in the response signal string 80 is the actual response of module 1 in functionality cluster 10.

Thus, as the response signal string 80 is subdivided into response segments, segment signatures are output in lock step from the programmable memory 74 in response to the counter 71 and the configuration state machine 75. It is observed that the configuration state machine receives the outputs of the segment counter 72 which it processes according to well-known techniques to provide a portion of the address input to the memory 74. In FIG. 6, the memory addresses are equal to the TCLK demarcations; this is for illustration only. In fact, the memory address would be determined by the considerations of a particular design, but the segment signatures would be provided in synchronism with the subdivision of the response signal string as illustrated in FIG. 6.

As the response signal string is fed to the comparator section 76 of the state machine 75, a bit-by-bit comparison is made between a response segment and a segment signature. This is represented in FIG. 6 by a comparator (C) having the same reference numeral as the comparator section 76 of FIG. 5. The output of the comparator 76 corresponds to the configuration signal which is entered into the register 42. The configuration signal is assembled by the state machine 75, which utilizes the results of the comparison to enable operable modules until a required complement is activated. If enough modules are obtained before the end of the response signal string for the functionality cluster is reached, the comparison between the response segments and segment signatures of the following modules is disregarded. This effectively holds disregarded modules in reserve for later use should one of the selected modules fail.

Figure 7:
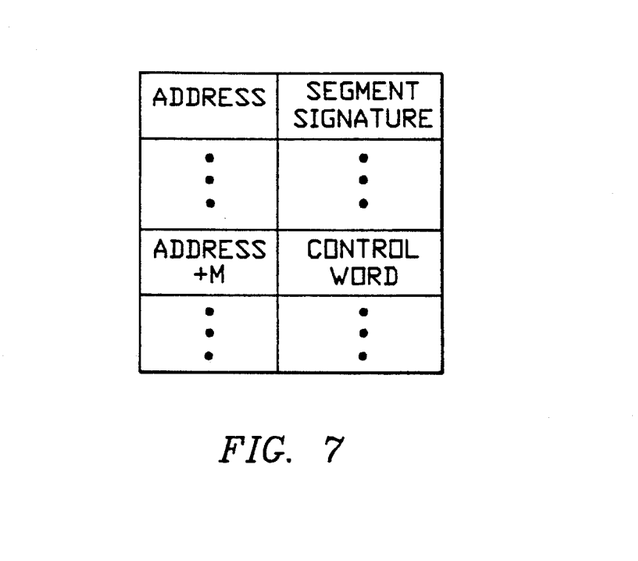
FIG. 7 is a memory map the programmed memory illustrated in FIG. 5.

In the best mode of practice, the map of the programmable memory 74 has the arrangement illustrated in FIG. 7. Segment signatures are stored in the memory at sequential addresses which correspond to the sequence with which the functionality clusters are tested. Following the reading of a segment signature, the state machine 75 alters the address to obtain a control word from a memory sector which is offset by M address locations from the sector of the memory where the segment signatures are stored. Thus, the sequence followed by the state machine is to obtain a control word configuring the state machine to prepare to divide a response signal string into respective functionality cluster portions. As the boundary of each functionality cluster portion of the response signal string is encountered, another control word is fetched which sets with the first response signal string segment and to construct the configuration signal for this module accordingly. Following the test of this segment signature, the next control word is fetched, and so on, until either not enough correct-operating modules are found or until the required complement is acquired.

It is submitted that control programming of the state machine is within the ken of the routineer.

Figure 8:
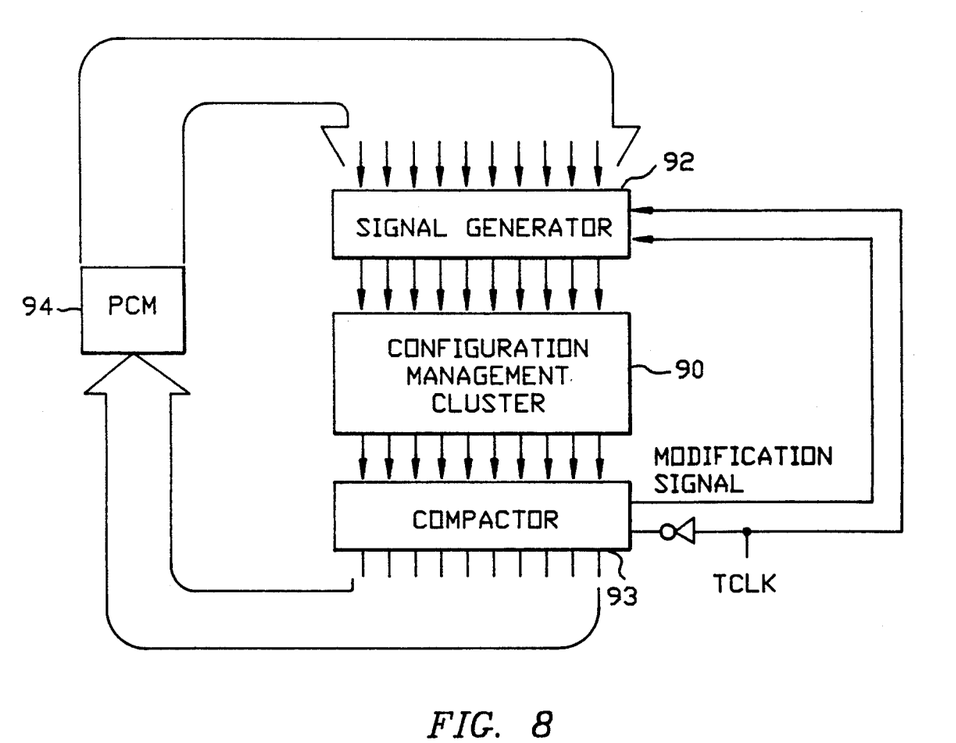
FIG. 8 illustrates an arrangement for testing the configuration management cluster of FIG. 1.

FIG. 8 illustrates an arrangement for self-test of the configuration management cluster. This arrangement permits the configuration management cluster to perform a feedback verification of its own performance and timing prior to initiating a test and configuration sequence. The arrangement permits the configuration management cluster to verify itself both functionally and physically with no external references. The price paid for this full autonomy is that of a minimum of redundancy in the management cluster, which, of course, implies an increase in device area occupied by the cluster.

The testing arrangement verifies the proper fabrication and operation (timing and functionality) of the configuration management cluster. Using the primary root polynomial design discussed above with respect to FIG. 3, a signal generator 92 generates a sequence of test signals, which is provided to the functionality cluster. The functionality cluster 90 generates a response signal string collected by a compactor 93. The signal generator 92 is seeded in the forward direction with a first primary root polynomial as described above and the compactor 93 is seeded in its forward directin by a second primary root polynomial. The compactor 93 outputs from its first storage device a modification signal as described above for provision to the test signal generator 92 in the form of the second primary root polynomial in reverse seeded fashion described above in connection with FIG. 3. The test signal generator and compactor are driven out of phase by provision of the positive sense of TCLK to the generator and inversion of the clock at 95 before provision to the compactor 93. This out of phase operation means that any response signal string acquired by the compactor 93 must have included at least one gate transition in the configuration manager 90. Thus, if an all-ones or all-zeroes state is detected, gate malfunction is inferred and the configuration manager will not self-validate. The response signal stream is provided to the signal generator 92 for modification of the generated test signal by way of a process control monitor 94. The process control monitor 94 receives the response signal and, in response, produces a process test signal by conventional means. The process test control is fed to the signal generator as a modification signal in the manner described above in connection with FIG. 3.

Process control monitors are conventional and are used to test the precision of circuit fabrication by measurement of fabrication artifacts such as capacitance and impedance. Thus, the test arrangement of FIG. 8 determines, first, whether the configuration management cluster 90 operates and, second, if operable, whether operation is fast or slow.

Self-verification by the configuration management cluster proceeds as described above for functionality clusters. That is, signatures for error-free operation are stored and compared with response strings actually generated by the configuration managment cluster.

Once the configuration management cluster has verified itself, it initiates parallel configuration of all the functional blocks by gating TCLK to each cluster and to the signal generator, compactor/signal generators, and last compactor, in parallel. TCLK initiates generation of test signals and response signal strings as described above. After a fixed number of cycles, the configuration management cluster receives a serial stream produced by concatenation of all response signal strings. The serial string is divided into the respective response signal strings; the response signal strings are segmented and the segments are compared to with segment signatures to verify the functionality of modules. The configuration management cluster then interconnects functional modules needed to form a system by means of the configuration signature which sets the multiplexing states of the steering buses. From the power-up reset, following its self-validation, the configuration management cluster connects the first set of good modules whose rsponse is detected in the serial stream.

The inventor contemplates that by sending the proper address to the wafer on the address bus of FIG. 1, the configuration manager can be invoked to retest the functionality clusters, seek out a new set of good modules and interconnect them for on-line functioning. Following configuration, the configuration management cluster conducts a quick conventional boundary scan by means not illustrated, and if the proper final signatures are returned from the boundary scan, the configuration management cluster releases the system, disables all test clocks, and initiates the operation of the system configured from the selected modules.

Configuration management redundancy can be provided not only at the modular level within a single configuration management cluster, but also at the cluster level by providing copies of a configuration management cluster.

Figure 9:
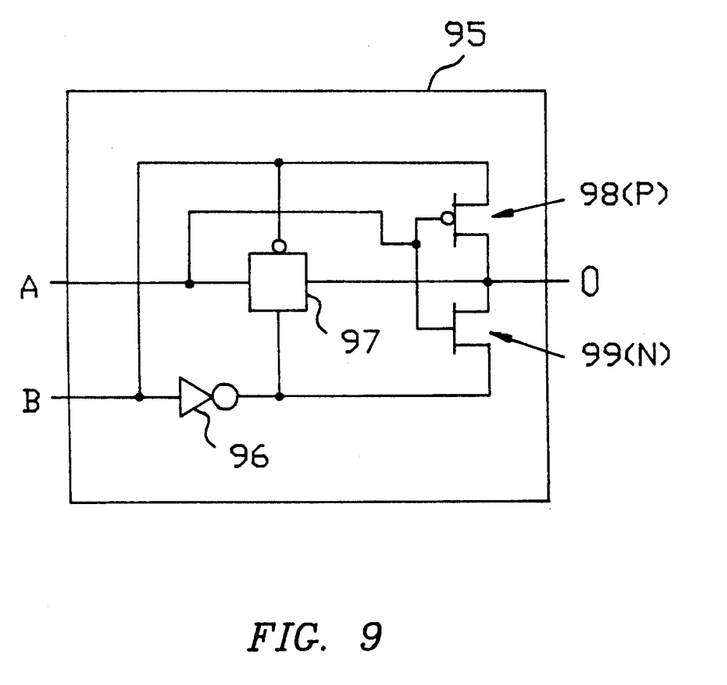
FIG. 9 illustrates a modulo-two adder implemented in CMOS technology which can be used in the test signal generator and compactor of FIG. 3.

FIG. 9 illustrates the CMOS technology implementation of a modulo-two adder 95 which can be used when the invention is expressed in a monolithic integrated circuit fabricated according to well-known CMOS techniques. Inputs to the modulo-two adder 95 are indicated by A and B, and the output by O. The CMOS modulo-two adder includes a CMOS inverter 96, a CMOS transmission gate 97, a P-channel transistor 98, and an N-channel transistor 99. Transistors 98 and 99 are series-connected, with their gates commonly driven by input A. Input B is inverted at 96. The transmission gate 97 is driven differentially by B and its complement available at the output of the inverter 96. The input of the transmission gate is connected to input A, and its output to the common drain connection between the series-connected transistors 98 and 97. The transmission gate 97 is configured to be turned on when B is low, and off when B is high. When turned on, the transmission gate 97 connects the signal at its input to the output node O at the drains of the transistors 98 and 99. The input B is connected, without inversion, to the source of the P-channel transistor 98. Input B is inverted and connected to the source of the N-channel transistor 99.

When A and B are both high, the gate 97 is turned off, and the N-channel transistor 99 is turned on, which connects the inverted form of input B to the output node O. Thus, with both inputs high, the modulo-two adder 95 outputs a low CMOS signal.

When inputs A and B are both low, the transmission gate 97 is turned on as is the P-channel transistor 98. This conditions the output node O to the low CMOS level of input A. Therefore, when the inputs A and B are both low, the output of the modulo-two adder is also low.

When input A is high and input B is low, the transmission gate 97 is turned on as is the P-channel transistor 99. This connects the CMOS high level of input A to the output node O. Thus, with input A high and input B low, the modulo-two adder 95 provides a high CMOS output. With input A low and input B high, the transmission gate 97 is off, but the P-channel transistor 98 is turned on, which provides the high CMOS level of input B at the output node O. Thus, with input A low and input B high, the modulo-two adder 95 provides a high CMOS output.

As those skilled in the art will appreciate, the modulo-two adder 95 also functions as an exclusive-OR circuit.

While I have described several preferred embodiments of my invention, it should be understood that modifications and adaptations thereof will occur to persons skilled in the art. Therefore, the protection afforded my invention should only be limited in accordance with the scope of the following claims.

I claim:

1. In a monolithic integrated circuit device which includes a functionality cluster and a mechanism for testing the operation of the functionality cluster by means of a test signal, a test signal circuit, which comprises:
   a test signal generator, including:
      a plurality (n) of storage devices, the storage devices being connected in a $N \times 1$ array for serial shifting of binary signals in a shifting direction from an nth storage device to a first storage device, each storage device having a position in the $N \times 1$ array which corresponds to a position of a respective variable in a polynomial of the nth degree;
      a first set of modulo-two means, each modulo-two means corresponding to a respective root variable of a first primary root polynomial (PRP1), the modulo-two means corresponding to the ith root variable of PRP1 being connected to the storage devices for conditioning the state of a storage device which corresponds to the position, in the shifting direction, of the ith root variable in PRP1, the modulo-two means conditioning the state of the storage device in response to a state of the first storage device and a state of the storage device corresponding to position $i+1$ in PRP1;
      a second set of modulo-two means, each corresponding to a respective root variable of a second primary root polynomial (PRP2), the modulo-two means corresponding to the jth root variable of PRP2 being connected to the storage devices for conditioning the state of a storage device which corresponds to the position, in a direction opposite the shifting direction, of the jth root variable of PRP2, the modulo-two means conditioning the state of the storage device in response to a modification signal and the state of the first storage device; and
   compactor means for generating the modification signal as a binary string representing PRP2.

2. The test signal circuit of claim 1, wherein the compactor means includes:
   a plurality (n) of storage devices, the storage devices being connected in a $N \times 1$ array for serial shifting of binary signals in a shifting direction from an nth storage device to a first storage device, each storage device having a position in the $N \times 1$ array which corresponds to a position of a respective variable in a polynomial of the nth degree; and
   a set of modulo-two means, each modulo-two means corresponding to a respective root variable of PRP2, each modulo-two means connected to the storage devices for conditioning the state of a storage device which corresponds to the position, in the shifting direction, of the ith root variable PRP2, the modulo-two means conditioning the state of the storage device in response to the state of the first storage device and a state of the storage device corresponding to the position $i+1$ in PRP2.

3. The test signal circuit of claim 1, wherein the storage devices are each connected to an input of the functionality cluster for parallel shifting of binary signals to the functionality cluster.

4. The test signal generator of claim 3, wherein the compactor means includes:
   a plurality (n) of storage devices, the storage devices being connected in a $N \times 1$ array for serial shifting of binary signals in a shifting direction from an nth storage device to a first storage device, each storage device having a position in the $N \times 1$ array which corresponds to a position of a respective variable in a polynomial of the nth degree; and
   a set of modulo-two means, each modulo-two means corresponding to a respective root variable of PRP2, each modulo-two means connected to the storage devices for conditioning the state of a storage device which corresponds to the position, in the shifting direction, of the ith root variable PRP2, the modulo-two means conditioning the state of the storage device in response to the state of the first storage device and a state of the storage device corresponding to the position $i+1$ in PRP2.

5. In an integrated circuit device which includes input and output terminals, at least one functionality cluster, means for configuring the functionality cluster by selectively connecting portions of the functionality cluster to input and output terminals in response to a configuration signal, and a test mechanism for testing the operation of the functionality cluster and indicating the operation by means of a response signal string, a configuration manager for generating the configuration signal, the configuration manager comprising:
   counting means for subdividing the response signal string into segments;
   segment signature means connected to the counting means and responsive to response signal string segments for producing functionality cluster segment signature signals, each segment signature signal being produced in response to a respective response signal string segment and including a binary string which represents the error-free generation of a response signal string segment by a predetermined portion of the functionality cluster; and
   configuration signal generating means connected to the counting means and to the segment signature means for generating a configuration signal conditioned to select functionality cluster portions which generate error-free test segment signal strings.

6. The configuration manager of claim 5, wherein the test mechanism includes:
a test signal generator, including:
a plurality (n) of storage devices, the storage devices being connected in a N×1 array for serial shifting of binary signals in a shifting direction from an nth storage device to a first storage device, each storage device having a position in the N×1 array which corresponds to a position of a respective variable in a polynomial of the nth degree;
a first set of modulo-two means, each modulo-two means corresponding to a respective root variable of a first nth-order primary root polynomial (PRP1), each modulo-two means connected to the storage devices for conditioning the state of a storage device which corresponds to the position, in the shifting direction, of the ith root variable in PRP1, the modulo-two means conditioning the state of the storage device in response to a state of the first storage device in a state of the storage device corresponding to position i+1 in PRP1;
a second set of modulo-two means, each corresponding to a respective root variable of a second nth-order primary root polynomial (PRP2), each modulo-two means connected to the storage devices for conditioning the state of a storage device which corresponds to the position, in a direction opposite the shifting direction, of the ith root variable of PRP2, the modulo-two means conditioning the state of the storage device in response to a modification signal in the state of the first storage device; and
compactor means for generating the modification signal as a binary string representing PRP2; and
gate means connected to the compactor means for generating the response signal string in response to the modification signal.

7. The configuration manager of claim 6, wherein the compactor means includes:
a plurality (n) of storage devices, the storage devices being connected in a N×1 array for serial shifting of binary signals in a shifting direction from an nth storage device to a first storage device, each storage device having a position in the N×1 array which corresponds to a position of a respective variable in a polynomial of the nth degree; and
a set of modulo-two means, each modulo-two means corresponding to a respective root variable of PRP2, each modulo-two means connected to the storage devices for conditioning the state of a storage device which corresponds to the position, in the shifting direction, of the ith root variable PRP2, the modulo-two means conditioning the state of the storage device in response to the state of the first storage device and a state of the storage device corresponding to the position i+1 in PRP2.

8. The configuration manager of claim 6, wherein the storage devices are each connected to an input of the functionality cluster for parallel shifting of binary signals to the functionality cluster.

9. The configuration manager of claim 8, wherein the compactor means includes:
a plurality (n) of storage devices, the storage devices being connected in a N×1 array for serial shifting of binary signals in a shifting direction from an nth storage device to a first storage device, each storage device having a position in the N×1 array which corresponds to a position of a respective variable in a polynomial of the nth degree; and
a set of modulo-two means, each modulo-two means corresponding to a respective root variable of PRP2, each modulo-two means connected to the storage devices for conditioning the state of a storage device which corresponds to the position, in the shifting direction, of the ith root variable PRP2, the modulo-two means conditioning the state of the storage device in response to the state of the first storage device and a state of the storage device corresponding to the position i+1 in PRP2.

10. In an integrated circuit device which includes a functionality cluster and the mechanism for testing the operation of the functionality cluster by means of a test signal, a self-validating configuration manager for configuring the functionality cluster in response to the test signal, the configuration manager comprising:
configuration cluster means connected to the functionality cluster and responsive to the test signal for connecting portion of the functionality cluster for circuit operation;
compactor means connected to the configuration cluster means for receiving a response signal produced by the configuration cluster in response to a test signal;
a process control monitor connected to the compactor for generating a process test signal in response to the response signal; and
a test signal generator connected to the configuration cluster means and to the process control monitor for producing the test signal in response to the process test signal.

11. The configuration manager of claim 10, wherein the signal generator includes:
a plurality (n) of storage devices, the storage devices being connected in a N×1 array for serial shifting of binary signals in a shifting direction from an nth storage device to a first storage device, each storage device having a position in the N×1 array which corresponds to a position of a respective variable in a polynomial of the nth degree;
a first set of modulo-two means, each modulo-two means corresponding to a respective root variable of a first primary root polynomial (PRP1), the modulo-two means corresponding to the ith root variable of PRP1 being connected to the storage devices for conditioning the state of a storage device which corresponds to the position, in the shifting direction, of the ith root variable in PRP1, the modulo-two means conditioning the state of the storage device in response to a state of the first storage device and a state of the storage device corresponding to position i+1 in PRP1;
a second set of modulo-two means, each corresponding to a respective root variable of a second primary root polynomial (PRP2), modulo-two means corresponding to the jth root variable of PRP2 being connected to the storage devices for conditioning the state of a storage device which corresponds to the position, in a direction opposite the shifting direction, of the jth root variable of PRP2, the modulo-two means conditioning the state of the storage device in response to a modification signal and the state of the first storage device; and
means in the compactor for generating the modification signal as a binary string representing PRP2.

12. The configuration manager of claim 11, wherein the compactor means includes:
- a plurality (n) of storage devices, the storage devices being connected in a N×1 array for serial shifting of binary signals in a shifting direction from an nth storage device to a first storage device, each storage device having a position in the N×1 array which corresponds to a position of a respective variable in a polynomial of the nth degree; and
- a set of modulo-two means, each modulo-two means corresponding to a respective root variable of PRP2, each modulo-two means connected to the storage devices for conditioning the state of a storage device which corresponds to the position, in the shifting direction, of the ith root variable PRP2, the modulo-two means conditioning the state of the storage device in response to the state of the first storage device and a state of the storage device corresponding to the position i+1 in PRP2.

13. The test signal circuit of claim 1, wherein each modulo-two means of the first set of modulo-two means includes a CMOS modulo-two adder, including:
- a P-channel and N-channel transistor pair connected in series at their drains;
- a transmission gate with an input and an output and with a pair of control ports, the output being connected in common with the drains of the transistor pair, and the input being to the gates of the transistor pair; and
- an inverter having an output connected to a first transmission gate control port and to the source of the N-channel transistor and an input connected to a second transmission gate control port and to the source of the P-channel transistor.

14. The test signal generator of claim 1, wherein the second set of modulo-two means includes, for the modulo-two means corresponding to the jth root variable:
- a first modulo-two adder having two inputs and an output, a first input being connected to an output of the storage device at position j−1 of the polynomial and the output being connected to the input of the storage device at position j in the polynomial; and
- a second modulo-two adder having two inputs and an output, the output being connected to a second input of the first modulo-two adder, a first input being connected to the output of the first storage device, and the second input being connected to receive the binary string representing PRP2.

15. The test signal generator of claim 15, wherein the first and second modulo-two adders are CMOS modulo-two adders, each including:
- a P-channel and N-channel transistor pair connected in series at their drains;
- a transmission gate with an input and an output and with a pair of control ports, the output being connected in common with the drains of the transistor pair, and the input being to the gates of the transistor pair; and
- an inverter having an output connected to a first transmission gate control port and to the source of the N-channel transistor and an input connected to a second transmission gate control port and to the source of the P-channel transistor.

* * * * *